(12) United States Patent
Regan

(10) Patent No.: US 6,756,242 B1
(45) Date of Patent: Jun. 29, 2004

(54) METHOD OF MODIFYING AN INTEGRATED CIRCUIT

(76) Inventor: Timothy James Regan, 6 Coneygere, Olney, Buckinghamshire MK46 4AF (GB)

( * ) Notice: Subject to any disclaimer, the term of this patent is extended or adjusted under 35 U.S.C. 154(b) by 0 days.

(21) Appl. No.: 10/018,867
(22) PCT Filed: Jun. 21, 2000
(86) PCT No.: PCT/GB00/02256
§ 371 (c)(1),
(2), (4) Date: Feb. 27, 2002
(87) PCT Pub. No.: WO00/79595
PCT Pub. Date: Dec. 28, 2000

(30) Foreign Application Priority Data

Jun. 21, 1999 (GB) .............................. 9914380

(51) Int. Cl.[7] .............................................. G06F 17/50
(52) U.S. Cl. ............................ 438/14; 438/17; 438/19; 716/9; 716/4
(58) Field of Search .............................. 438/14, 13, 12, 438/11, 17, 19; 716/5, 4, 6, 7, 9, 16, 15, 3, 2, 14, 19, 13; 364/491, 489, 488, 490, 300

(56) References Cited

U.S. PATENT DOCUMENTS

| | | | |
|---|---|---|---|
| 4,630,219 A | * | 12/1986 | DiGiacomo et al. ........... 716/9 |
| 5,200,807 A | | 4/1993 | Eguchi |
| 5,612,893 A | | 3/1997 | Hao et al. |
| 5,856,754 A | | 1/1999 | Yamashita |
| 5,862,260 A | * | 1/1999 | Rhoads ....................... 382/232 |
| 5,936,868 A | * | 8/1999 | Hall ............................... 716/4 |
| 6,279,142 B1 | * | 8/2001 | Bowen et al. ................. 716/5 |
| 6,381,730 B1 | * | 4/2002 | Chang et al. .................. 716/5 |

FOREIGN PATENT DOCUMENTS

JP  03211677  9/1991

OTHER PUBLICATIONS

Gold, S.M., et al.: "A quantitative Approach to Nonlinear Process Design Rule Scaling VLSI", proceedings 20th anniversary conference on advanced research in VLSI/IEEE Computer Society, 24th Mar. 1999, pp. 99–112, XP–000952431 Atlanta, GA, USA.

Havenmann, R.H., et al.: "Electron–beam fabrication of a 1.25βm, 16–bit I²L microprocessor", XP–000952394, J. Vac. Sci. Technol., 19(4), Nov./Dec. 1981, pp. 901–904, 1981 American Vacuum Society.

* cited by examiner

Primary Examiner—Carl Whitehead, Jr.
Assistant Examiner—Laura M Schillinger
(74) Attorney, Agent, or Firm—Fay, Sharpe, Fagan, Minnich & McKee, LLP

(57) ABSTRACT

The invention provides a method of modifying an integrated circuit, the method including the steps of selecting a scaling factor (72), scaling the circuit (74) according to the scaling factor, and adjusting the circuit for functionality and design rule compliance (75–78). The method makes it possible to scale a circuit without losing functionality or destroying the hierarchy of the circuit.

27 Claims, 17 Drawing Sheets

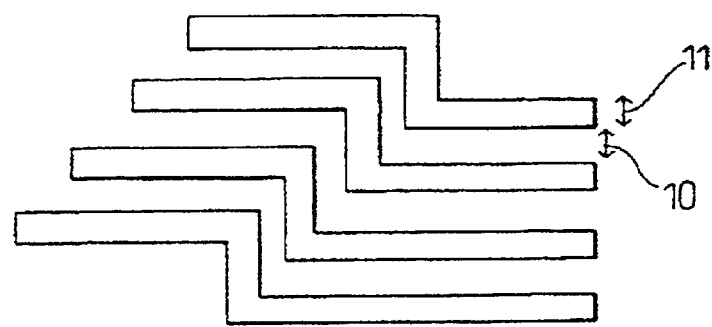
*Fig. 4*
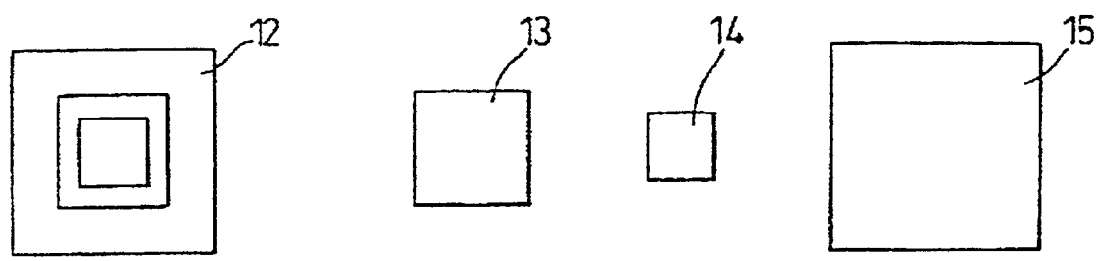
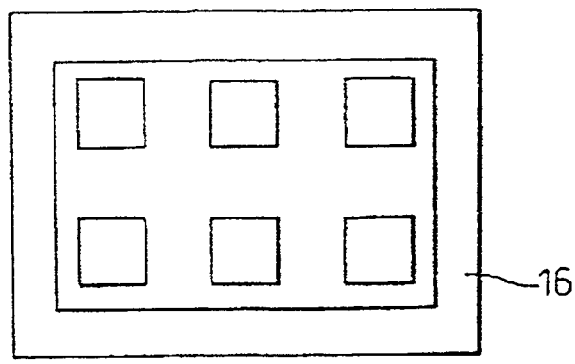
*Fig. 5*

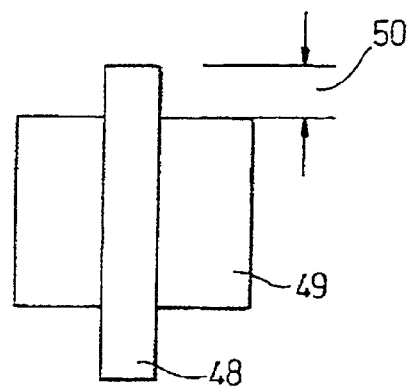
Fig. 16
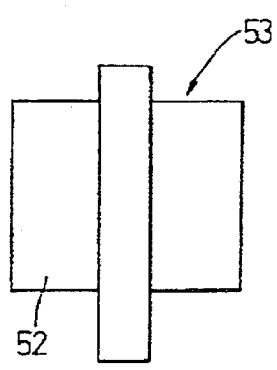 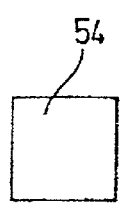  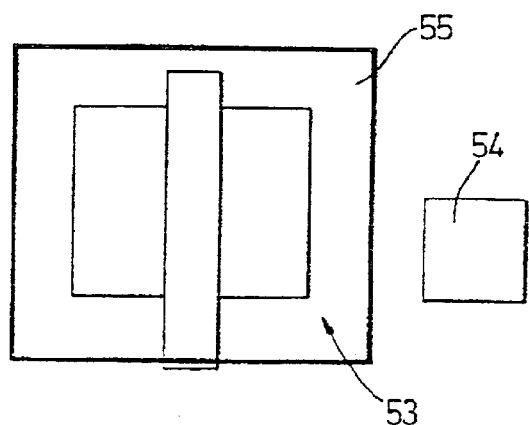
Fig. 17a          Fig. 17b

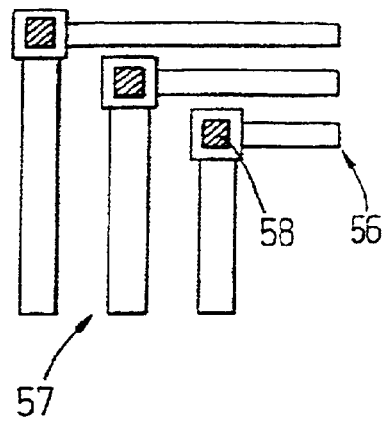
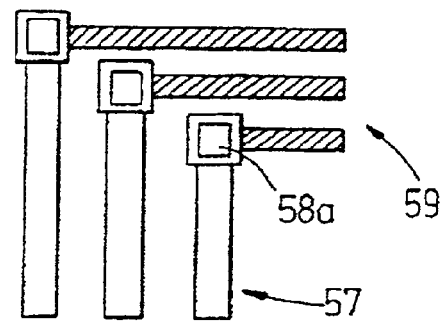
*Fig. 18a*  *Fig. 18b*
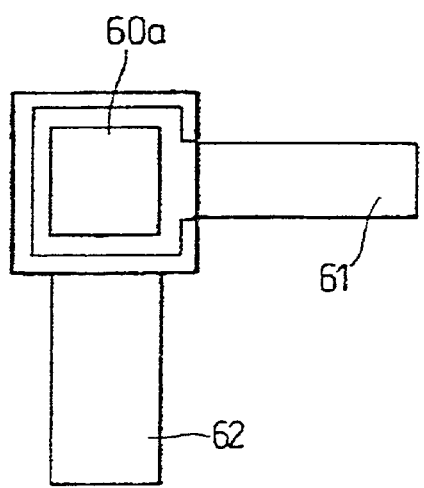
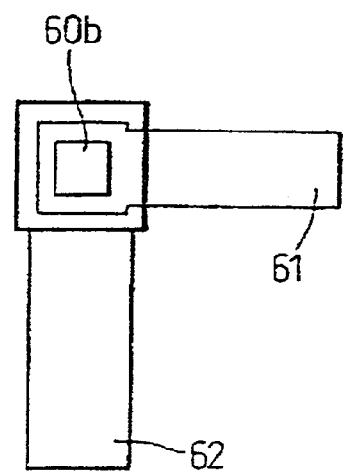
*Fig. 19a*  *Fig. 19b*

Node Properties:

Width = 2.0μm
Length = 0.5μm
Type = "pmos"

Node Properties:

Width = 4.0μm
Length = 25.0μm
Value = 500 ohms
Type = "ndiffusion"

Node Properties:

Width = 150μm
Length = 110μm
Area = 1550μm
Value = 0.025pF
Type = "Metal/Polysilicon"

METHOD OF MODIFYING AN INTEGRATED CIRCUIT

The present invention relates to a method of modifying an integrated circuit, in particular through a series of scaling operations.

In particular, but not exclusively, the invention relates to a process by which the physical design or layout of an integrated circuit or subcircuit can be modified to meet a different set of design and manufacturing rules. This method involves analysing data of the existing integrated circuit to determine the scaling factor then altering the shapes in the original by scaling the data, scaling individual layers, adjusting the edges of shapes and swapping geometries and cells through a defined sequence, according to a process migration technique.

Process migration is a technique for modifying integrated circuit designs so that they can be manufactured by new manufacturing processes with different geometric sizes and relationships. The physical size of an integrated circuits is limited by the manufacturing process used. The limiting factor is the size of the smallest component that can be produced, which at present is approximately 0.13 microns.

As new processes are devised, components can be manufactured to smaller sizes. However, before an existing circuit can be built at a smaller scale using a new manufacturing process, the circuit layout must be re-designed. The overall plan of the circuit may be approximately the same, but different parts and components of the circuit may need to be scaled by differing factors. There are rules governing these critical dimensions. Some rely on manufacturing constraints, for example the smallest feasible size of a connection, whereas others depend on electronic factors such as capacitance and resistance.

When re-designed, computers can check the circuits for compliance with these design rules.

There may be various reasons for switching to a new manufacturing process, including:

1) SPEED: smaller components have faster switching due to smaller charge transfer requirements and smaller sing distances.

2) SIZE: unit costs are lower, as more chips can be made per silicon wafer

3) ECONOMIC PRODUCTION: more products can be made on one production line, allowing older, less economical, production lines to be closed.

The main problem is how to modify the physical design of the circuit. This can be very difficult and complicated.

Another reason for re-designing the chips is that many circuits are now designed using parts or components supplied by different manufacturers, called "system-on-chip" components. However, these components may be produced by different manufacturers and made to different design rules, and need to be re-designed so that they all comply to the same set of design rules.

Reasons for re-designing might therefore include:

1) Compliance with particular design rules;

2) To make use of the latest manufacturing processes; and

3) To reduce the size of the component by a certain factor.

Existing methods of process migration are as follows:

Symbolic Migration. In this, each component, such as each transistor, is re-generated according to required technical specifications. The process is not very successful especially for complicated circuits.

Compaction. It is known, for example from U.S. Pat. No. 5,640,497, to provide a method of redesigning layouts. In this method, the circuit is made smaller by squeezing all the dimensions to the smallest allowed by the design rules, first in the x direction and then in the y direction. The technique is partially successful, but "flattens" the circuit: i.e. it destroys the hierarchy of the building blocks. This requires huge computing power to achieve and, because the hierarchy can no longer be identified, it makes subsequent modification extremely difficult.

Scaling. Scaling implies reducing the size of each component by a constant factor. While this reduces the size of the component, the resulting circuit will generally be inoperable as it is likely to break many hundreds of thousands of design rules. Therefore, while this is sometimes seen as the ideal solution, it has not previously been achievable.

It is an object of the present invention to provide a method of scaling an integrated circuit that mitigates at least some of the aforesaid problems.

According to the present invention there is provided a method of modifying an integrated circuit, the method including the steps of selecting a scaling factor, scaling the circuit according to the scaling factor, and adjusting the circuit for functionality and design rule compliance.

The method makes it possible to scale a circuit without losing functionality or destroying the hierarchy of the circuit.

Advantageously, the scaling factor is selected by calculating a plurality of predetermined scaling ratios and selecting a scaling factor that is equal to or greater than the largest of the predetermined scaling ratios. This ensures that the circuit is scaled to the maximum degree without violating essential design rules. Advantageously, the predetermined scaling ratios include the interconnect scaling ratio, the via size ratio and the electrical component geometry ratio.

Advantageously, the scaling factor is selected by rounding up to the next whole grid point from the largest of the predetermined scaling ratios. This ensures that the components of the circuit are placed correctly on the design grid.

Advantageously, the step of scaling the circuit according to the scaling factor circuit includes multiplying the co-ordinates of the circuit geometry by the scaling factor.

Advantageously, the step of adjusting the circuit for functionality and design rule compliance includes a hierarchical layer scaling process. The hierarchical layer scaling process may include the step of scaling the components in a layer according to a predetermined layer scaling factor. This may be achieved by absolute scaling (adding or subtracting a fixed amount to the size of each component), or alternatively by relative scaling (multiplying to increase or decrease the size of each component by a fixed percentage of its original size). The hierarchical layer scaling process may include the step of scaling the components so as to maintain the connectivity of those components. The hierarchical layer scaling process may include the step of identifying components that meet predetermined width criteria, and scaling only components that do not meet those criteria. In this way, power connectors can be excluded from the scaling process, to avoid overheating problems.

Advantageously, the step of adjusting the circuit for functionality and design rule compliance includes a transistor edge adjustment process. The transistor edge adjustment process may include the step of adjusting the width of the polysilicon layer and/or the length of the diffusion layer. This restores the correct dimensions of the components making up the transistors, to ensure functionality.

Advantageously, the method includes the step of updating the contacts and vias. The step of updating the contacts and vias may include removing the existing contacts and vias and replacing them with new contacts and vias, to reduce current density.

Advantageously, the method includes the step of adding and/or deleting layers, to accommodate changes in technology.

Advantageously, the method includes the step of checking the circuit using a layout verification process to ensure compliance with design rules.

Advantageously, the method includes the preliminary step of analysing and modifying the circuit data, to reduce the time needed to complete the migration process Advantageously, the method includes the step of adding nodes containing design parameters to devices in the circuit, so allowing easy access to information about those devices.

It is a further object of the present invention to provide a different process migration technique which may be described as "complex scaling" and which is applicable to the computer model of the layout of any existing integrated circuit. By using this technique, the layout of a chip may be modified to be manufactured in any new process and at any scale that meets the new design rules.

The method is applicable to flat chips layouts and those containing design hierarchy, which may be defined as the placing of sub-cells into higher level circuits and these, in turn, being placed again. The hierarchy of the migrated chip matches the hierarchy of the original.

According to another aspect of the present invention, there is provided a method of scaling an integrated circuit comprising the steps of examining the existing layout to determine the amount by which the layout must be scaled, including determining variable geometry values; absolute geometry values; and a design grid, and carrying out one or more of gate width and length adjustment; layer scaling; polygon edge adjustment; contact replacement; adjust overlaps; addition or removal of layers; cell swapping; and verification.

An embodiment of the invention will be now be more particularly described by way of example and with reference to the accompanying drawings, in which:

FIG. 4 shows interconnect spacing;

FIG. 5 shows via geometries and arrays;

FIG. 16 shows layer overlap;

FIG. 17 shows a new well defined around an existing diffusion;

FIG. 18 shows moving routing data between layers;

FIG. 19 shows swapping new via cells for old;

Figure 1:
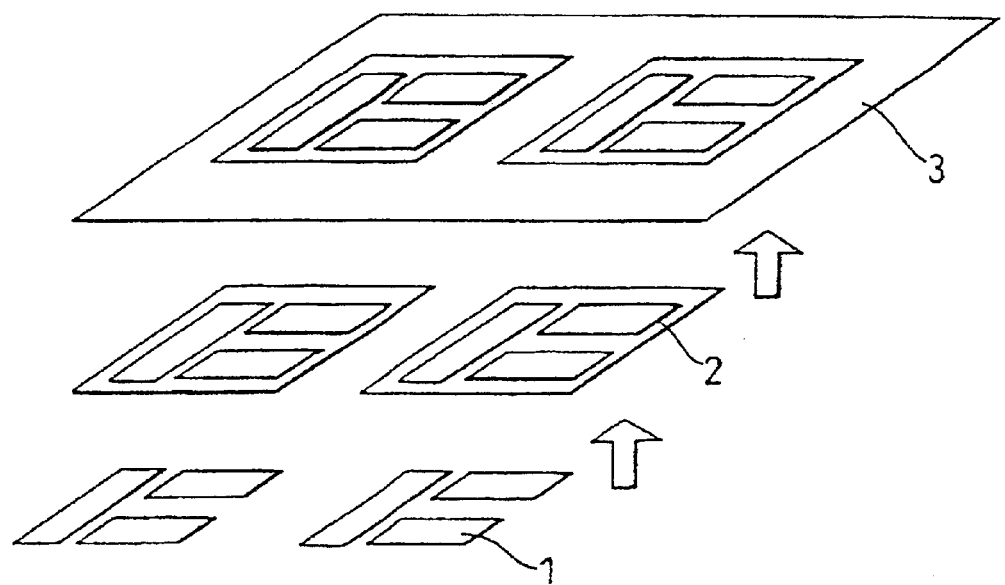
FIG. 1 shows circuit hierarchy where building blocks of circuitry are placed into larger blocks which can be placed again into yet larger blocks.

A typical circuit hierarchy is shown in FIG. 1. Building blocks 1 of a circuit are placed into larger blocks 2, which can be placed again into yet larger blocks 3.

The cell migration process consists of three distinct steps:
1) Calculating the ideal scaling factor;
2) Scaling the entire circuit using the calculated factor; and
3) Fixing any errors in the circuit.

These steps are described in more detail below.

In the first step, the ideal scaling factor is calculated using at least three sets of equations, which are described in more detail below with reference to FIGS. 2 to 6. When each of these equations has been solved, the scaling factor used is the smallest allowed by all of the equations. In other words, the end circuit is no smaller than is allowed by all of the equations.

In the second step, the entire circuit is scaled using the calculated factor. This is done by multiplying every dimension by the same factor, which includes the positions of the building blocks, the positions and dimensions of the connectors, the positions of components within building blocks and the geometries of those components.

As shown in FIG. 7, the end result is a scale copy of the original circuit. However, many design rules will have been violated and component values will be incorrect: e.g. the width and length of the transistors may be too big or too small, giving either slow operation or non-operation. The resistors and capacitors may also have incorrect values.

Figure 11:
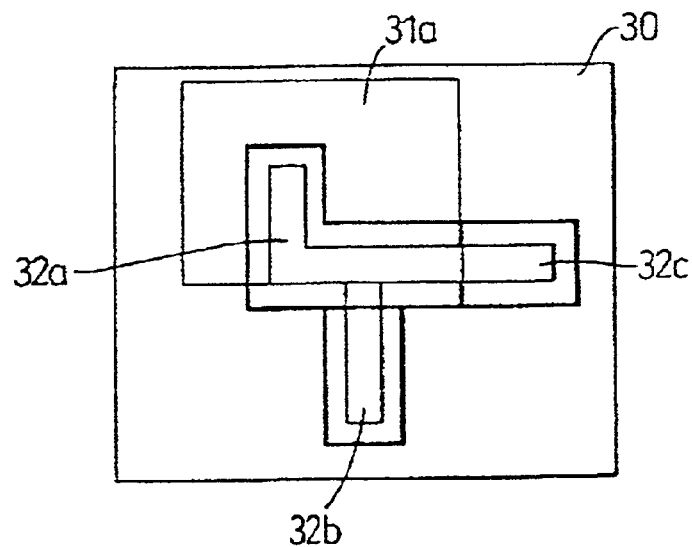
FIG. 11 illustrates hierarchical layer shrink with connectivity.

The third step is to fix the errors. There are various steps to the fixing operation, as follows:

1) The size of all the geometries in any particular layer may be adjusted, by adjusting the layer size. For example, the co-ordinates of the shapes in the polysilicon layer may be adjusted. This is know as "layer sizing". For example, the area of polysilicon over the diffusion making up the transistor may be increased or decreased so as to achieve the minimum dimensions or to provide minimum separations. This is shown in FIGS. 10–11. The dimensions are changed by a fixed amount (e.g. 0.2 microns) rather than as a percentage of the original shape.

Figure 12:
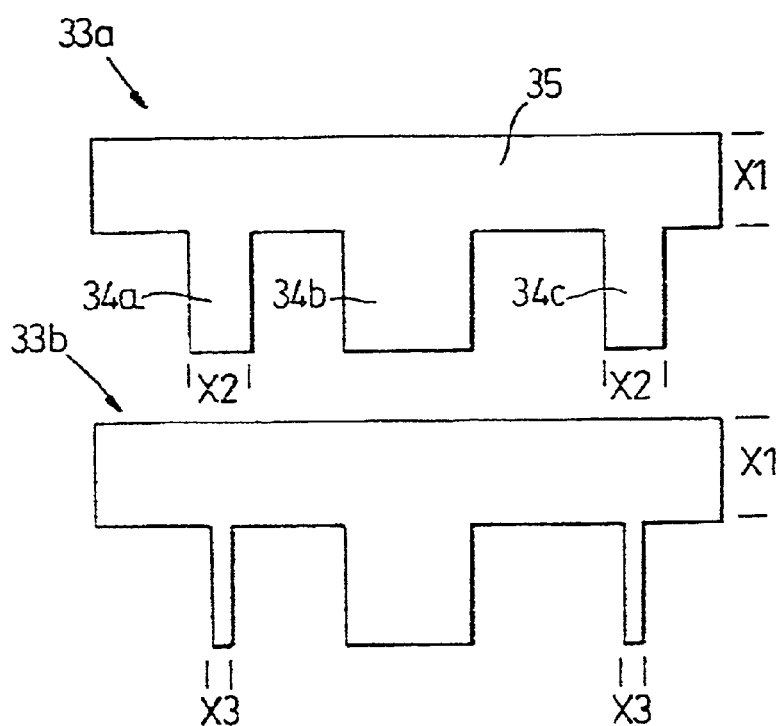
FIG. 12 shows layer sizing by geometry width.

2) Some parts of some components may be left unaltered: in particular power connectors are not reduced in size, as this could affect the current flow in the circuit. The power connectors are identified by their size, as they are often larger than the other connectors, or by their signal name. The control logic therefore keeps components of a particular size unaltered, and reduces the size only of those that fall below a certain limit. This is shown in FIG. 12.

Figure 13:
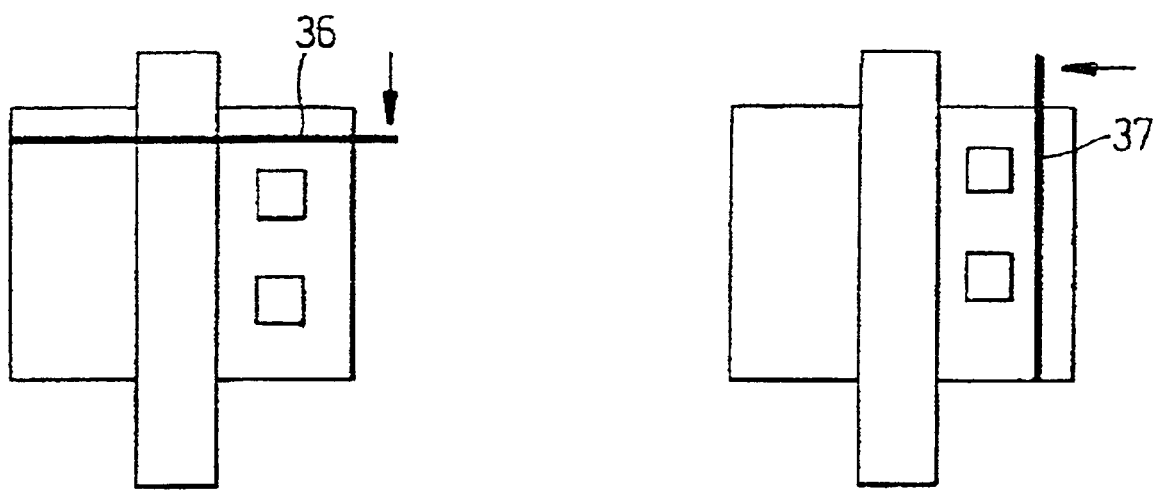
FIG. 13 shows edge adjustment for transistors.

3) Edge Adjustment. If the area of a component is too large, or if one edge is too close to another component following layer sizing or scaling, it can be adjusted by moving one edge of the component rather than by changing the size of the whole component. This is shown in FIG. 13. For example, the size of a transistor can be altered in this way.

The scaling process therefore consists of three steps:

1) Overall scaling to a fixed factor;
2) Fixed scaling of components (layer scaling), which may include up to three separate steps; and
3) Edge adjustment.

The process may in addition include the following features, which are preferred but not essential.

1) Contact removal and replacement (see FIG. 15) it is desirable to provide as many electrical contacts as possible on each component, so reducing the current density through those contacts. Instead of re-scaling the contacts, it is better simply to remove them and then insert as many contacts as possible in the space available, according to the new design rules.
2) Adding and removing layers (see FIG. 17). Some manufacturing processes need more layers than previous ones, and some do not require as many. The process can be modified to add or subtract layers as required. For example, if the new process requires an extra layer to make a transistor, the computer can be arranged to identify each transistor (for example by recognising a layer of polysilicon over a diffusion layer), and then add an extra layer as required.

The process and the steps making up the process will now be described in more detail. The technique for modifying the circuit involves a series of steps that scale the data and modify the shapes contained within it to comply with a set of design rules that govern the manufacturing process for production of the finished chip.

The techniques contained in this process will work for all components and connection geometries on a chip including, but not restricted to, MOSFET and bipolar transistors, resistors, capacitors and diodes.

The input data for the process migration can be any existing chip or IC layout or the intellectual property contained therein, in an industry standard format such as GDSII or CIF. These files will contain the data that makes up the chip and may include rectangles, polygons, paths, instances, arrays and labels.

A modification sequence will include some or all of the following:

Design analysis and scaling calculations;
General scaling;
Gate width and length adjustment;
Layers scaling;
Polygon edge adjustment;
Contact replacement;
Adjust overlaps;
Addition or removal of layers;
Cell swapping;
Verification.

In order to apply a factor to the general scaling calculations it is necessary to examine the existing layout to determine the amount by which the layout must be scaled. There are three factors that must be taken into account in this process:

1. Variable geometry values;
2. Absolute geometry values;
3. The design grid.

Taking the first of these, namely variable geometry values, many of the design rules in an integrated circuit manufacturing process are given as a minimum value and must be met or exceeded when designing the circuit. An example of this would be a rule that determines the spacing between two geometries on the same layer that is enforced to ensure that the two geometries do not merge together during manufacture. The spacing rule may be exceeded as long as the mom value given is not violated.

Examples of variable geometry values include widths, spacings and enclosures of layers.

Figure 2:
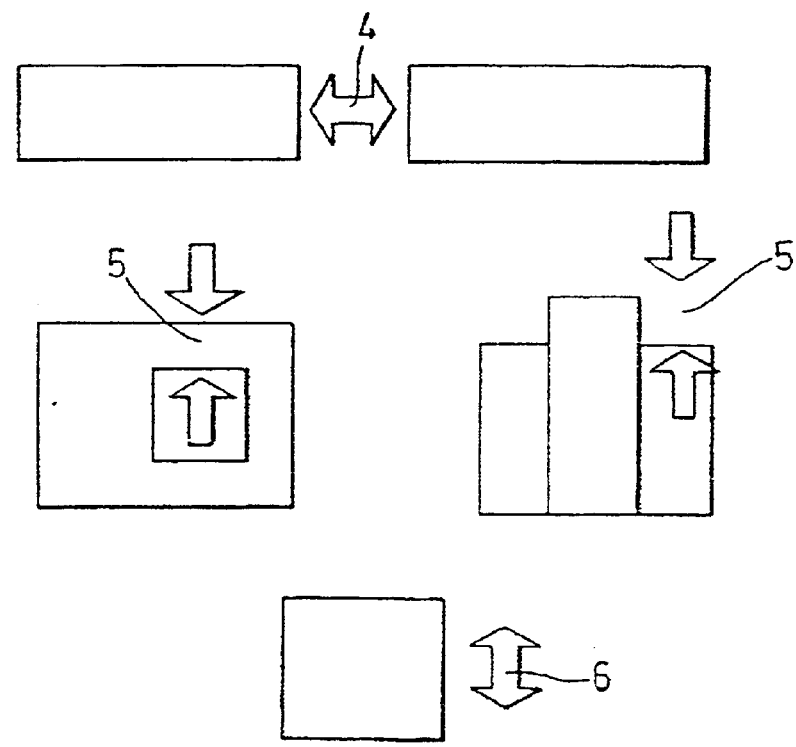
FIG. 2 shows variable rule examples, where geometry must be equal to or greater than a set distance and width.

FIG. 2 shows variable rule examples, where the separation 4, the overlap 5 and the width 6 of different geometries must be equal to or greater than a set dance.

The second actor relates to absolute geometry values. Integrated circuit design rules usually have fixed values for certain geometries that must be met and cannot be exceeded. These are usually applied to contact and via holes that connect routing circuitry and this value must be met for each occurrence of these shapes. In addition, transistor sizes are defined in the circuit net list and this must be matched in the layout. Failure to meet these values will result in errors when checking the layout against the circuit schematic or netlist.

Figure 3:
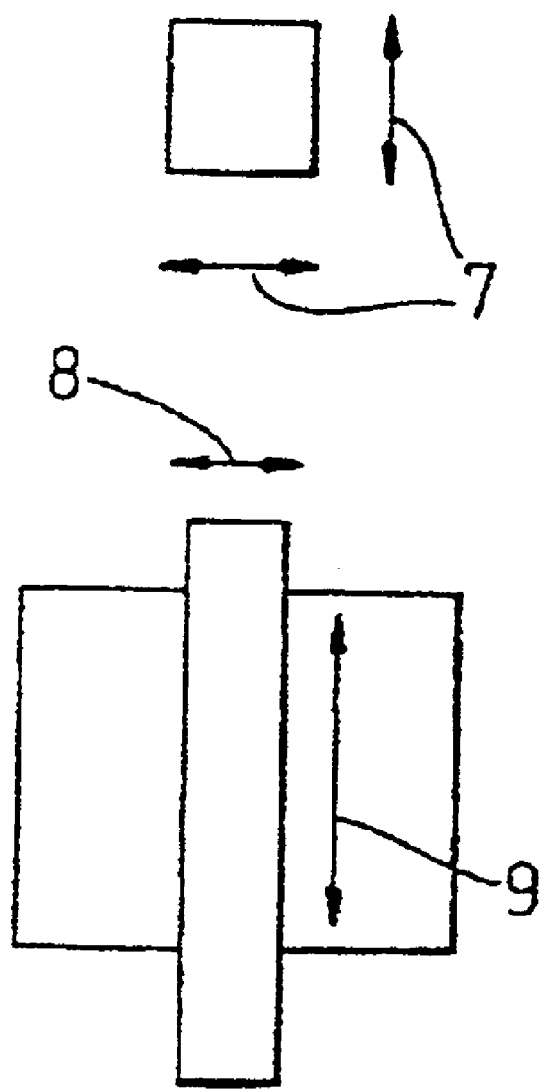
FIG. 3 shows fixed geometry value examples, where geometry dimensions must equal a defined value.

As shown in FIG. 3, examples of fixed values include contact and via sizes 7, transistor sizes 8, resistor sizes and capacitor sizes. Fixed geometry value examples are shown, where geometry dimensions must equal a defined value.

Finally, all integrated circuits are designed to have the co-ordinates of each shape as a multiple of a pre-defined grid. The scaling factor must take the new design grid into account and this can be accomplished in two ways, by calculating the scaling factor to ensure that the co-ordinates of all shapes in the scaled layout fall on the grid, or by snapping co-ordinates to the grid as they are scaled. All co-ordinates in the final chip must be place on the defined design grid The scale factor for any process migration will be calculated from the ratio between the rules in the new manufacturing process specification and the rules used for the original device. There are three distinct parts of a chip that can be the limiting factor in scaling the design and the ratio of each must be calculated. The largest of the three ratios will be defined as the limiting factor in sling the chip.

1. Interconnect Scaling Ratio.

The width and spacing for each routing layer must be calculated as a ratio defined by: Interconnect scaling ratio= (new width+new spacing)/(old width+old spacing) FIG. 4 shows interconnect spacing 10 and width 11.

2. Via Size Ratio and Enclosure.

The via size is the size of the fixed rectangles that make up the via holes between routing layers:

Via size ratio=Max ((new via 1/old via 1), (new via 2/old via 2), . . . )

FIG. 5 shows a via geometry 12 that includes a first layer 13, a via 14 and a second layer 15, and a 3×2 array 16 of via geometry.

3. Transistor geometry ratio.

The transistor geometry ratio is the relative shrink of the shapes that make up the distance between two transistors in separate pieces of diffusion:

Transistor geometry ratio=New (2a+2b+2c+2d+e)/Old (2a+2b+2c+2d+e)

Figure 6A:
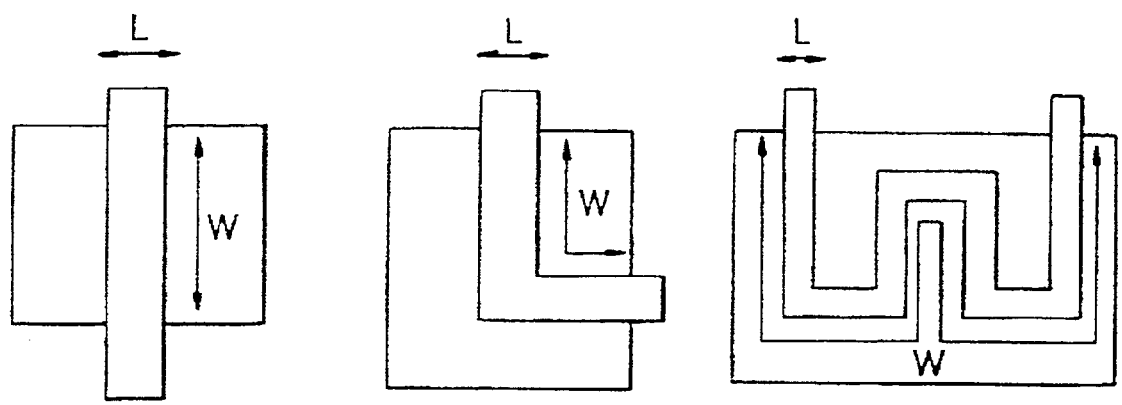
FIGS. 6a and 6b show CMOS transistor geometry.
Figure 6B:
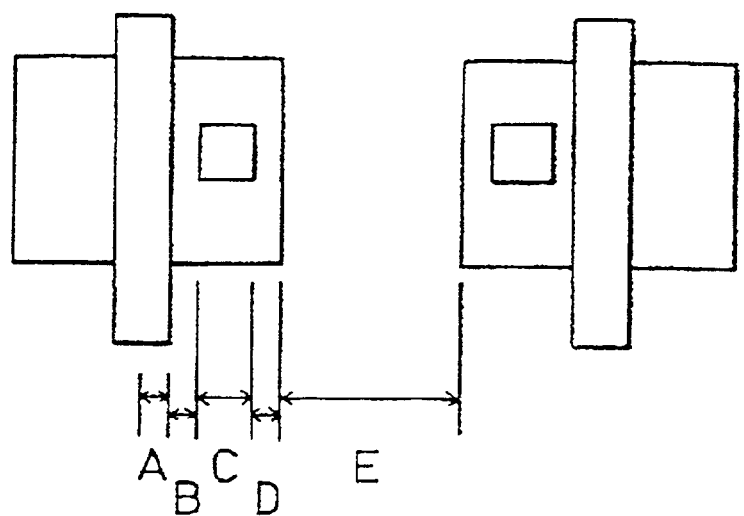
Figure 6C:
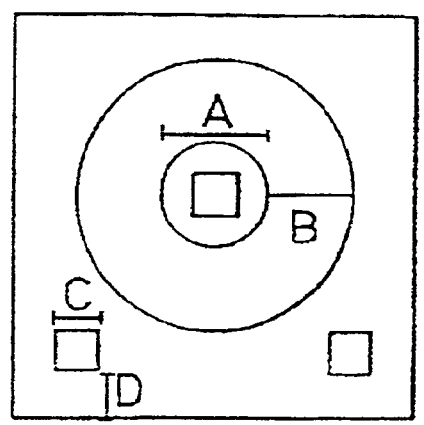
FIG. 6c shows spacing considerations in a lateral transistor.

FIGS. 6a and 6b show various CMOS transistor geometries, where L=transistor length and W=transistor width The maximum value derived from these calculations will determine the scaling factor. This scaling factor is rounded up to the next whole grid point, i.e. mod (scale grid)=0.

A fourth factor that may need consideration concerns circuits that contain resistors and capacitors. These need to be scaled depending on the values of the materials used to construct them in the two manufacturing processes. Resistors and capacitors are defined by the value per square unit of the materials used in their construction. The ratio of these values in the old and new manufacturing process is used to calculate the scaling factor for these circuit components. This is described in more detail below with reference to FIGS. 23 and 24.

Once the scaling factor has been determined, it is applied to each cell and geometry in the whole chip. Each co-ordinate is multiplied by the scaling factor to reduce the chip in size while keeping the geometries and hierarchy of the chip intact. At this stage, the new chip will be identical to the old in everything but scale.

The scaling of geometries and cells may be defined as coordinate scaling. Each scalar value is adjusted by:

(x co-ord*scale)(y co-ord*scale)

Figure 7A:
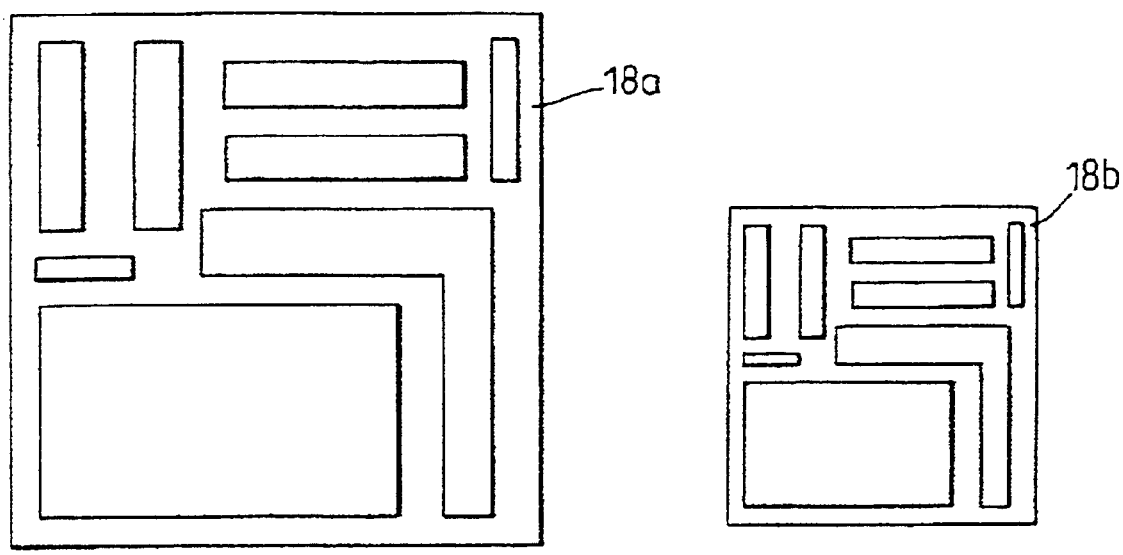
FIGS. 7a and 7b show general scaling.
Figure 7B:
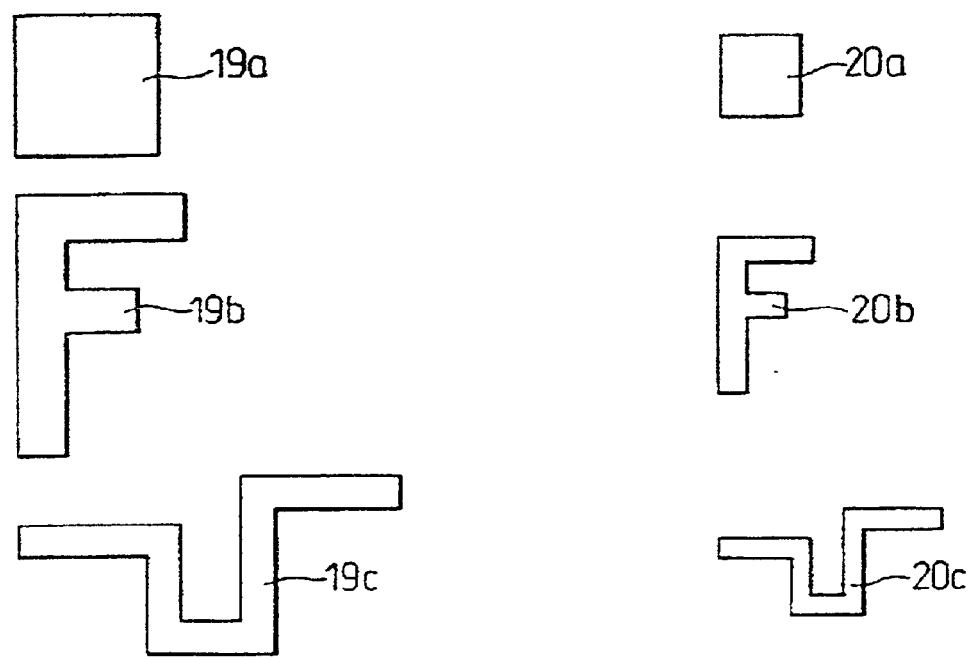

FIGS. 7a and 7b show general scaling. In the general scaling process, the original chip 18a is scaled down to create the new chip 18b, and each shape 19a, 19b, 19c in the original chip is replaced by a scaled down shaped 20a, 20b, 20c. In each case, the new dimensions are equal to the old dimensions multiplied by the scaling factor. Each shape within the layout will be adjusted relative to the origin of the chip's axis, i.e. x=0y=0.

Figure 8:
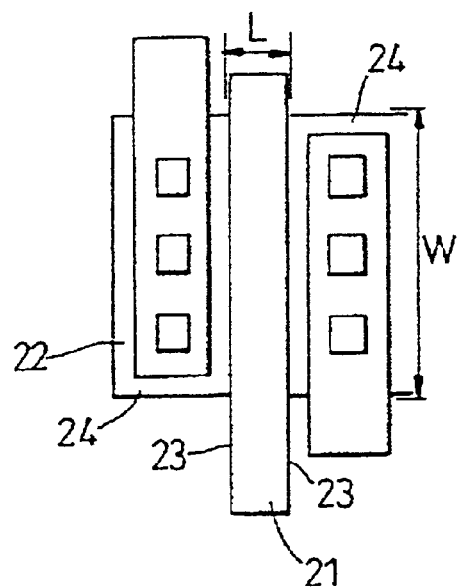
FIG. 8 shows CMOS transistor definition and transistor edge adjustment.

The CMOS transistors in a circuit are determined by the overlap of two materials, doped silicon, known as diffusion, and polysilicon or occasionally metal. When scaling the width and length of a transistor, it is not always possible to apply an absolute value to every diffusion and polysilicon shape through the layout. Instead, the diffusion and polysilicon that make up the width and length of the transistor must change by a percentage of the transistor size and so each one must be scaled in turn and adjusted as a multiple of its current size. This involves the use of an edge adjusting method that identifies the edges of diffusion and polysilicon that make up each transistor's width and length and moving them to meet the required component value. Edge adjustment can be considered as distinct from scaling. FIG. 8 shows a CMOS transistor definition and value definition.

The individual transistors are identified with a Boolean operation that places a maker shape over any area where polysilicon 21 crosses diffusion 22. These shapes will form the basis for the rest of the transistor sizing operations in a circuit containing CMOS transistors.

Figure 9:
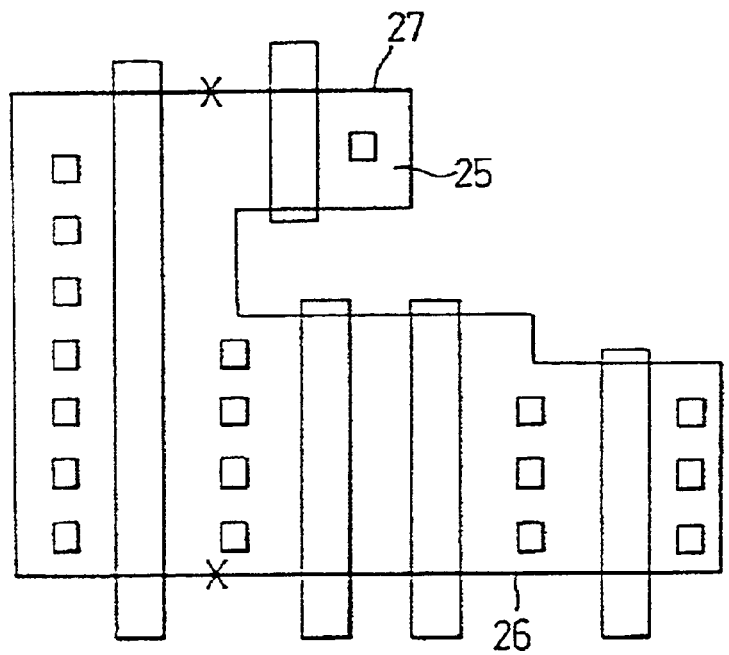
FIG. 9 shows adjusting the gate width of multiple transistors formed on a single diffusion geometry.
Figure 10A:
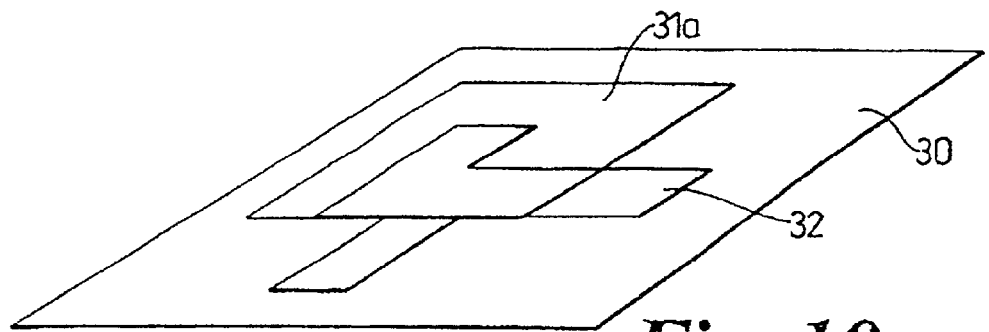
FIG. 10 is illustrative of layer shrinking breaking connectivity.
Figure 10B:
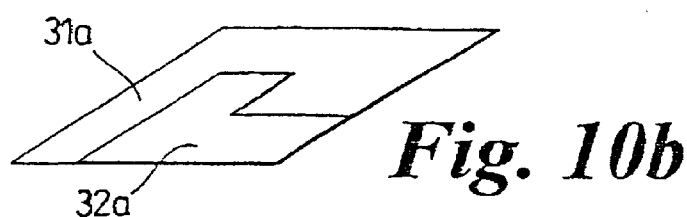
Figure 10C:
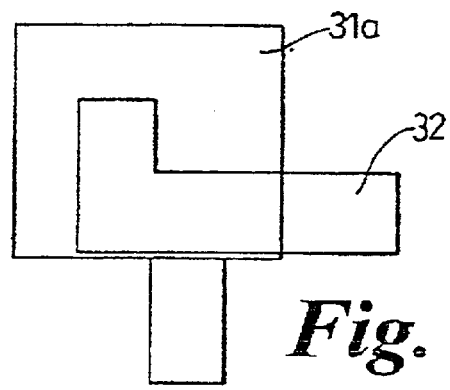
Figure 10D:
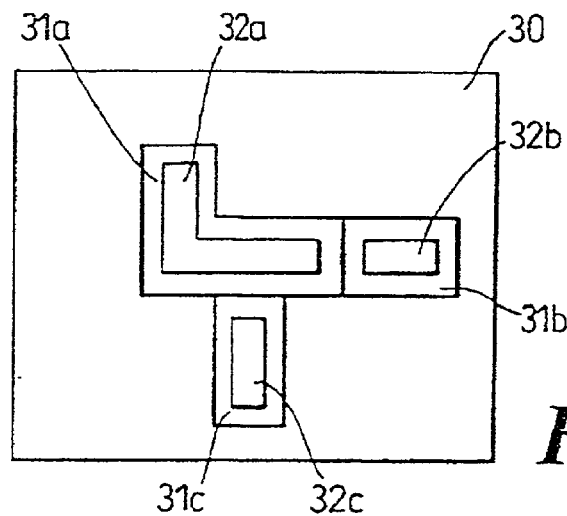

The diffusion and polysilicon edges that make up the transistor are selected and moved by a percentage of the gate width or length to adjust the value of the transistor. One piece of diffusion may make up several transistors so the scaling routine must process each edge in turn to achieve the correct value for all of its transistors. FIGS. 8 and 9 show CMOS transistor edge adjustment.

As shown in FIG. 8, the gate length L of a transistor can be altered by adjusting the edges 23 of the polysilicon 21 forming the gate. The width W is adjusted by moving the edges 24 of the diffusion 22 across the polysilicon 21. By adjusting these edges 23 and 24, the parameters of the transistor can be altered, thus changing their effect on the overall circuit.

As shown in FIG. 9, many transistors may be constructed out of one piece of diffusion material 25, and adjusting the edges that make up one transistor may therefore have an effect on the others. By examining each edge on the diffusion, adjustment may be made that ensure all transistors meet required parameters. If necessary, an edge making up more than one transistor may be split to accommodate the required device sizes. For example, the edges 26 and 27 may be split at the points marked "X" to make the changes correctly.

Some manufacturing processes may require transistor sizes to change by a differing amount, depending on their original size or function in the circuit, so a method of defining them such as an equivalence table may be used to adjust the scaling process to meet these restrictions.

Once the entire layout has been scaled, each layer that makes up the design must be grown or shrunk to meet the design rules of the new manufacturing process. This is achieved with a technique called hierarchical layer scaling, which can grow or shrink the shapes in the circuit while maintaining connectivity between cells.

All of the shapes on a layer may be merged together with a Boolean function before scaling to remove excess overlaps between shapes and maintain connections between shapes on the same layer. In order to maintain the electrical integrity of the circuit, the connections between shapes on the various layers must be maintained, even if these shapes occur at a different level in the hierarchy. If they become separated, the circuit will not function so it is essential that the layer scaler takes this into account.

The problems of layer connectivity only occur when the layer in question is to be shrunk and the data contains hierarchy. By moving all of the edges of a shape inwards, they will detach from the shapes in sub-cells and this will break the electrical connectivity in the circuit.

FIG. 10 is illustrative of layer shrinking breaking connectivity. The circuit includes a top cell 30 and a number of sub-cells 31a, 31b, 31c. A shape 32a in the sub-cell 31a abuts shapes 32 in the top cell. If all the shapes 32a, 32b, 32c shrink they will become detached from each other, as shown in FIG. 10d.

In order to remedy this, the shapes in the sub-cells are copied to the top level and merged with the data at that level before the shrink is applied. Once the shrinking process is complete, the shapes from the sub-cell are applied as a template to remove any excess material.

It is also possible to hold layer data to the edge of a cell which is defined by the bounding box of the cell's data or by a shape representing the boundary. Layout data may be held on the boundary of the cell to preserve scaling connectivity.

FIG. 11 illustrates hierarchical layer shrink with connectivity. In the example all three shapes 32a, 32b, 32c shrink but they retain the connection between them. Only the non-connected edges are shrunk. Further rules may be applied to the layer scale to restrict its operation to shapes that match given size rules, i.e. they are less than or greater than a given dimension. This allows data on the same layer to be scaled by differing amounts.

FIG. 12 shows layer sizing by geometry width, the original shape 33a being replaced by the modified shape 33b. In this example, segments 34a, 34b, 34c of the shape can be shrunk if they meet size criteria. The shrunk segments 34a, 34c stay attached to the large segment 35.

In order to meet all of the design rules for the migrated chip, it is necessary to make adjustments to parts of the shapes that make up the chip rather than the shapes as a whole. This can be described as "polygon edge adjustment", which examines each vertex of a shape and adjusts it according to its position relative to other shapes in the layout.

The edges to be adjusted may be defined by the shapes on an individual layer or identified for modification by Boolean logic to define their function in the circuit. Once this has been determined, the edges can be adjusted by an absolute value from their current position or relative to another edge on the same or a different layer. They may also be adjusted by a percentage of their distance to another edge on the same or different layer. FIG. 13 shows edge adjustment for transistors. It is possible to adjust a first edge 36 that defines the transistor, or a second edge 37 for minimum overlap of transistors or contacts.

Integrated circuit layouts use contact and via holes in dielectric layers to allow routing layers to connect the circuit's components. These are typically square shapes with a size and spacing defined in the technology's design rules. Connections between wide tracks of material require bigger contact areas. This may be defined by one big contact or, more usually, as an array of uniform contact shapes.

Contact and via shapes may be scaled as above. Alternatively, the existing contacts and vias may be removed and replaced with arrays of new shapes conforming to the new design rules. These may either be cells that make up the contact as a single array of shapes or a series of rectangles that cover the area to be connected. This area is defined through a sequence of Boolean functions that isolate the area to be connected. The new shapes conform to the new design rules by construction rather than scaling.

Figure 14A:
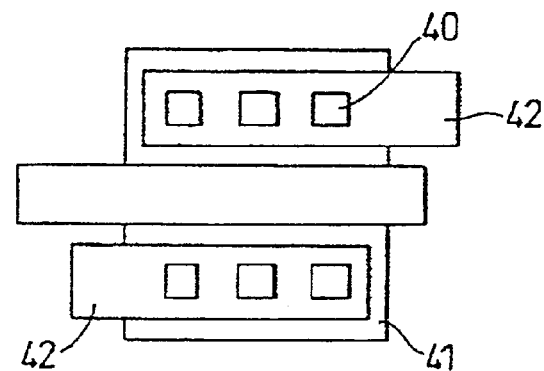
FIG. 14 illustrates the use of contacts and vias to connect components of the circuit.
Figure 14B:
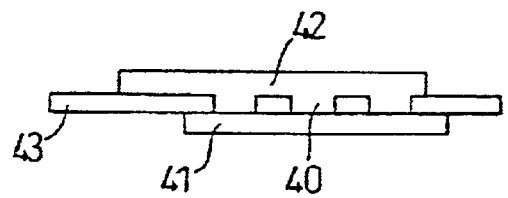

Contacts between other materials such as metal and polysilicon ray be updated using the same techniques. As shown in FIGS. 14a and 14b, contacts and vias 40 are used to join the silicon 41 in the components to the metal wires 42 that connect the circuit. They are also used to connect different layers of metal together to allow for complex wiring. Most integrated circuits will have multiple layers of wiring connecting the components. These contacts and vias are actually holes in the dielectric material 43 that separates the different layers from each other.

Contact shapes from metal to silicon are often created as simple polygons rather than instances and each of these is replaced with a new shape that meets the new design rules. Each contact is removed and replaced with a new shape that has the correct dimensions.

Figure 15A:
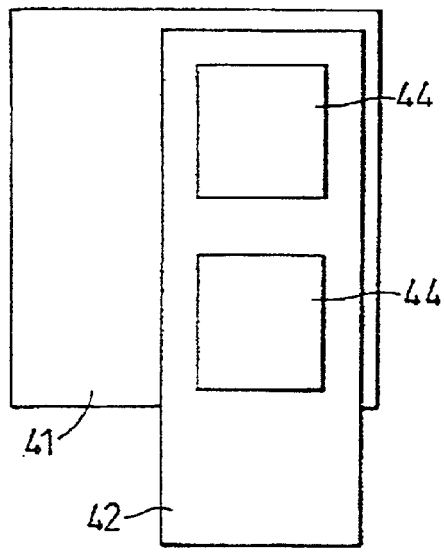
FIG. 15 shows contact removal and replacement.
Figure 15B:
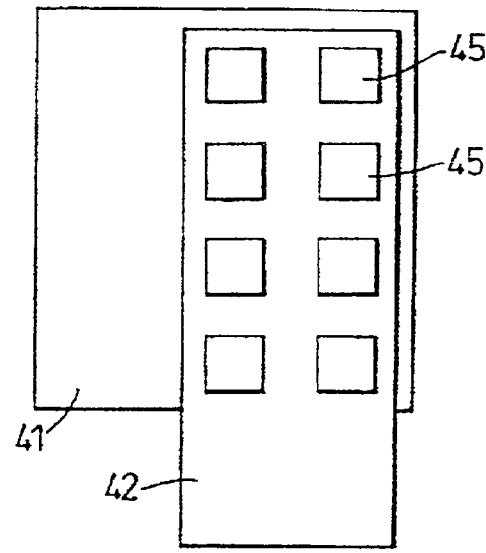

In many cases, it is preferable to add as many contacts as possible between layers to help reduce current density through each contact. This can be achieved by identifying the area containing the contacts through a series of Boolean functions, and this area can be filled with as many contacts as will fit. For example, as shown in FIGS. 15a and 15b, the two large contact holes 44 of the old technology placed where the metal 42 overlaps the silicon 41 can be replaced in the new technology by eight smaller contact holes 45.

Certain layers in an integrated circuit's layout are required to overlap other layers by an amount defined in the design rules. These layers are forced to comply with the design rules through Boolean logic or through edge adjustment as defined above.

Common examples of layer overlap include polysilicon overlap of gate and metal overlap of contact. FIG. 16 shows layer overlap. The polysilicon 48 must overlap the diffusion 49 by a minimum fixed distance 50.

Variations between integrated circuit manufacturing processes may mean that some layers in the original chip need to be removed and others added. Examples of this would be implant layers or isolation wells.

All shapes on superfluous layers are removed hierarchically, by identifying each shape on that layer and deleting it.

New layers may be defined in relation to an existing layer, possibly in conjunction with another layer: e.g. by placing a well around a diffusion layer, but only if it is crossed by polysilicon and makes a transistor. For example, FIG. 17a shows a diffusion 52 in a transistor 53 and a diffusion 54 outside the transistor. As shown in FIG. 17b, a new layer 55 in only added around the diffusion that is part of the transistor 53.

Data can also be promoted to new layers such as extra routing layers. Routing information may be promoted from an existing layer up to a new layer. This will allow the layout to be compressed to take advantage of gaps created when these shapes are moved. FIGS. 18a and 18b show moving routing data between layers. In the old arrangement shown in FIG. 18a, a first metal routing 56 is connected to a second metal routing 57 through a metal1–metal2 via 58. In the new arrangement shown in FIG. 18b, routing information from a first metal routing 56 promoted to a third metal routing 59 and the vias 58a are changed accordingly.

FIGS. 19a and 19b show swapping new via cells for old The via cell 60a defined by the old technology contains shapes for connecting two metal layers, fist metal 61 and second metal 62. This is swoped for a new via cell 60b containing shapes for connecting the metal layers in the new technology. Most vias are placed as instances of a sub-cell that contains the three shapes that are used to construct it: two metal layers and a via layer. These can simply be replaced with a new via cell containing the same three layers, or re-sized to the new design rules. Some vias may be larger than minimum size and have multiple via holes connecting the two metal layers. When swapping these for a new via cell, the new cell is sized to match the number of via shapes in the old. By swapping each via cell in this way, the vias in the circuit are updated to meet the constraints of a new technology.

Once the entire circuit or a portion thereof has been migrated, it is verified using industry standard design tools. These will include a design rule checking (DRC) system and a layout-versus-schematic system (LVS). These will ensure that the newly migrated chip conforms to the new design rules and has retained the integrity of the connections within the circuit.

In addition, an interconnect timing analyser may be applied at any time to check the layout will perform correctly in the new manufacturing process. This may be applied after general scaling as a rough guide to the circuit's performance in the new process, even though it does not conform to the new design rules. A more accurate simulation will be available once the migration process is complete.

When the layout migration is completed and the new chip has passed verification, it may be delivered in an industry standard format such as GDSII or CIF.

Figure 20:
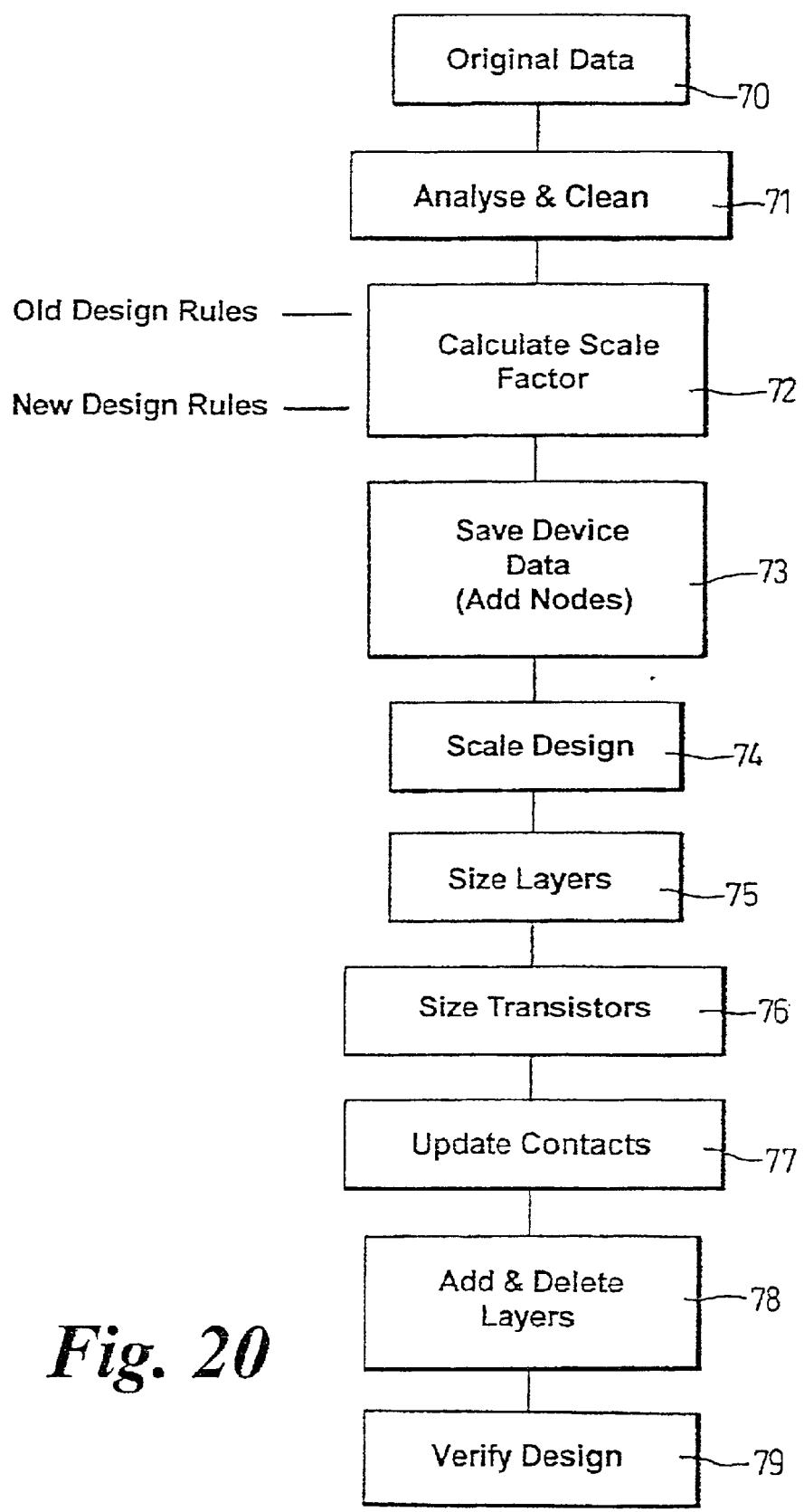
FIG. 20 shows the steps of the migration process in the form of a flow diagram.

The steps of the migration process will now be described with reference to the flow diagram shown in FIG. 20.

The first step 70 is to input the original data. The original data is supplied in an industry standard format such as GDSII or CIF. The database will contain the shapes that make up the layout of the circuit and will include circuit elements such as rectangles, polygons, paths, instances, arrays and text. Connectivity information may also be contained in the database but the migration tools do not need this information to function.

The second step 71 is to analyse and clean the data. The time taken to migrate the data may be improved by modifying some of the data before starting the main migration routines. This could include merging separate overlapping shapes or converting interconnect elements from polygons to paths. Changes in the hierarchy of the circuit may also be useful such as converting individual shapes that make up a connection between layers to an instance of a connection cell.

While these techniques may improve the migration process, they are not necessary to complete the migration process.

The third step 72 is to calculate the scale factors. The scaling factor in a process migration will be determined by the ratios of the rules of the old manufacturing process and the rules in the new one. Examples of these rules are given above.

The fourth step 73 is to save the device data. Information contained in the original database may be referenced by programs throughout the migration process and so it is useful to be able to refer to this data easily. One technique, which is described in more detail below with reference to FIG. 22, is to add a node containing design parameters to each device in the layout. These nodes can be used to store information about the devices such as sizes or names of drawing layers.

The fifth step 74 is to scale the design. Once the scaling factor is decided, each co-ordinate in the design is multiplied by that scaling factor, giving a design identical to the original in everything by size.

The data for each element is scaled as follows:

| | |
|---|---|
| Rectangle: | Lower-left(X) * scale |
| | Lower-left(Y) * scale |
| | Upper-right(X) * scale |
| | Upper-right(Y) * scale |
| Polygon: | co-ordinates(X) * scale |
| | co-ordinates(Y) * scale |
| Path: | co-ordinates(X) * scale |
| | co-ordinates(Y) * scale |
| | width * scale |
| Text: | co-ordinate(X) * scale |
| | co-ordinate(Y) * scale |
| | font size * scale |
| Instance: | co-ordinate(X) * scale |
| | co-ordinate(Y) * scale |
| | magnification * scale |
| Array: | co-ordinate(X) * scale |
| | co-ordinate(Y) * scale |
| | magnification * scale |
| | delta(X) * scale |
| | delta(Y) * scale |

The sixth step 75 is to size the layers. Once the data is scaled, each layer may be sized to meet the minimum width value defined in the design rules. This may be done to ensure that the data on each layers meets the rule for spacing and also has the advantage of reducing capacitance on each layer and improving circuit performance. Overall scaling calculations may take a subsequent adjustment in a layer's size into account when deciding on the primary scaling factor for the design.

Layers may be scaled by an absolute value or by a percentage of the layers size. To scale a layer by an absolute value, the following calculations are applied:

| | |
|---|---|
| Rectangle: | Lower-left(X) + value |
| | Lower-left(Y) + value |
| | Upper-right(X) − value |
| | Upper-right(Y) − value |
| Polygon: | co-ordinates(X) + or − scale |
| | co-ordinates(Y) + or − scale |
| Path: | width * scale |

Addition or subtraction of the scale number will depend on the position of the co-ordinate on the hull of the shape. If it is on the a bottom or left edge of the shape, the scale number will be added to the co-ordinate, if it is on the top or right edge of the shape, it will be subtracted.

Relative scaling involves multiplying each co-ordinate in the shape by the same scale factor to adjust the co-ordinates.

The data for each element is scaled as follows:

| | |
|---|---|
| Rectangle: | Lower-left(X) * scale |
| | Lower-left(Y) * scale |
| | Upper-right(X) * scale |
| | Upper-right(Y) * scale |
| Polygon: | co-ordinates(X) * scale |
| | co-ordinates(Y) * scale |
| Path: | co-ordinates(X) * scale |
| | co-ordinates(Y) * scale |
| | width * scale |

This technique will resize the shapes but it will also offset them from their position relative to the rest of the shapes in the circuit. In order to return them to their original position, the centre point of each shape can be calculated and the new shaped moved back to the central position of the old. The centre point is defined by taking the middle of the rectangular convex hull of the shape.

The seventh step 76 is to size the CMOS transistors. The shapes that make up the transistors will be sized along with all of the other shapes in the layout when general scaling is performed. Further sizing may occur when individual layers are scaled when those layers are part of a transistor, i.e. diffusion or polysilicon. However, transistors may need to be scaled to account for other factors such as circuit timing and driving capabilities. The transistor scaling process is described in more detail above with reference to FIGS. 8 and 9. In addition, the resistors and capacitors may also be adjusted, as described in more detail below with reference to FIGS. 23 and 24.

The eighth step 77 is to update the contacts. This process is described in more detail above with reference to FIG. 15.

The ninth step 78 is to add and/or delete layers. Different manufacturing technologies may have a different number of layers making up the chip. Examples of this include implant and well layers.

These new layers are generated around existing layers and this can be achieved by copying each shape in the defining layers, oversizing it and then moving it onto the new layer. Any gaps between shapes on this new layer should be filled with the same material if they are found to be less than the specified minimum distance in the design rules.

If the old layout contains shapes that are not required for the new manufacturing process, each of these shapes can be deleted from the database.

The tenth step 79 is to check the design. Once the oration process has been completed, the design can be checked using standard layout verification methods. These include design rule checking (DRC) and layout verses schematic checking (LVS). It may also be useful to perform a comparison between the old and new layouts (LVL). All of these checking techniques are considered standard in the electronics industry and software to perform these checks is available from a variety of vendors.

Transistors are adjusted by altering the dimensions of the shapes that are used to construct them. This is true for bipolar (NPN & PNP) devices and MOS (field effect) devices. Bipolar transistors can usually be considered as discrete components but MOS devices will often be combined to save space in the circuit. The scaling calculations for a bipolar device will be governed by the rules that make up that device, which will include minimum widths, spacings, overlaps and enclosures.

The ratio of each of these rules in the old and new design rule specifications must be accounted for in the scaling calculations. The sizes for a CMOS transistor are defined by the common region of polysilicon overlapping diffusion. The width and length of the overlap defies the value of the transistor and adjusting the edges of the two shapes alters its value.

Figure 21:
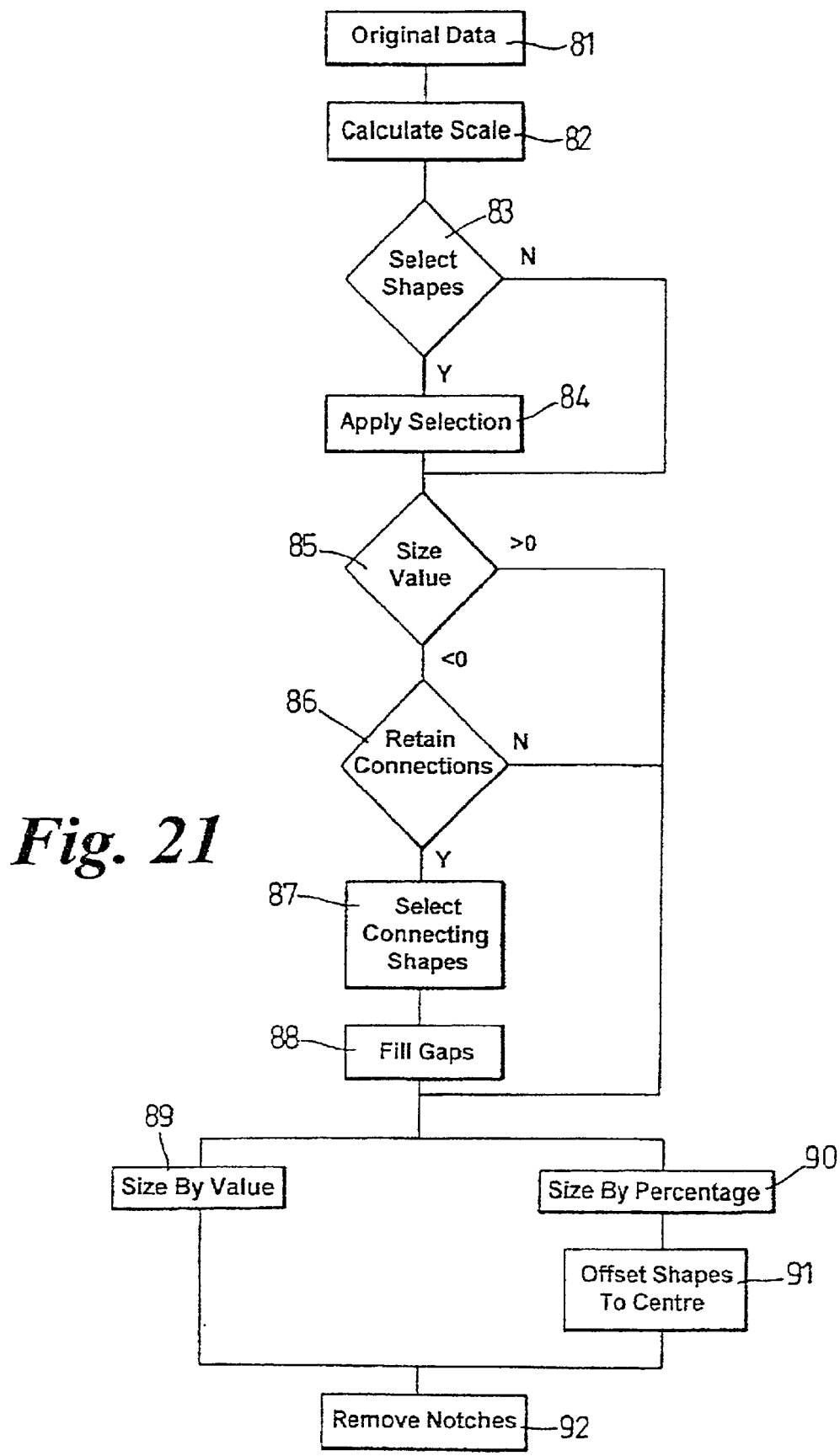
FIG. 21 shows the steps of the layer sizing process as a flow diagram.

The layer scaling process will now be described in more detail with reference to FIG. 21. In order to meet the specifications of the new design rules, individual layers may need to be scaled up or down after general scaling is complete. This will ensure that the data will meet the requirements of the new manufacturing process and metal connection layers are reduced to their minimum width to reduce capacitance in the circuit. Layer scaling is most often applied to interconnection layers and the diffusion and polysilicon layers that make up CMOS transistors.

The first step is to take the original data 81 and calculate the scaling factor 82. The scale factor for each layer is calculated after the general scaling factor has been applied and can be applied as an absolute value or as a percentage. These are calculated as:

$$\text{Absolute value}: \frac{(\text{old layer width} * \text{general scale}) - \text{new layer width}}{2}$$

$$\text{Percentage value}: \frac{\text{new layer width}}{\text{old layer width} * \text{general scale}}$$

The sizing value derived is taken from each side of a shape, hence the need to divide the value by 2.

It may be necessary to only alter the sizes of certain shapes while retaining others as they are. An example of this would be the wide power supply metal that is on the same layer general interconnect shapes. In this case, only shapes that were narrower than a certain value would be under or over sized. The process includes the steps of selecting the shapes 83 that should be scaled and applying the scaling factor 84 to that selection.

When the polygon shapes on a layer are undersized, they will become detached from each other thus breaking the electrical integrity of the circuit. This must be prevented to ensure that the circuit still functions after the sizing procedure. This is further complicated if the shapes attach to other shapes at different levels of the circuit's hierarchy as the problems of attachment will depend on where the shapes are placed. If the shapes in question are oversized, they will still overlap each other so this problem will not arise. The process includes the steps of selecting the undersized shapes 85 and selecting from those the shapes for which it is necessary to retain connections 86.

One method of keeping all of the shapes within a cell connected is to merge the shapes together before sizing them. This means that no connected shapes are discrete from each other and so will not become detached through the sizing process.

Connections between shapes at different levels of the hierarchy can be maintained by copying the original shapes to a temporary layer before under-sizing the data layer. Data on each sub-cell can be under-sized in turn while leaving the outline of the original in place. When layer data in a cell touches the temporary layer in a sub-cell, the connection can be maintained using a sequence of Boolean operations to select connecting shapes 87 and fill the gaps 88 between the top cell and sub-cell and maintain electrical integrity.

Once the size value and connectivity information has been defined, the shapes can be sized by an absolute value 89 or a percentage 90, followed by offsetting the shapes 91, as required.

A useful post processing function for layer sizing involves removing small notches 92 and bumps on each of the shapes on a layer that can be generated by the re-sizing programs These should be removed as they are likely to result in errors being reported at the design rule checking stage.

A method for storing old design values in node properties will now be described with reference to FIGS. 22*a*, 22*b* and 22*c*. Before the layout of the integrated circuit is modified, it is useful to store the information about the current layout through some method for reference throughout the modification process. The information to be stored may include the sizes of the components that make up the circuit such as the widths and lengths of the transistors or the values of resistors and capacitors. By storing this information before modifying the design, subsequent modification routines can check their values against initial values without regard to how that data has been affected by the scaling process.

One method of storing this data is to save it to an ASCII file and use this for reference, but this has the disadvantage of being divorced from the database containing the layout and needs to have detailed information on the location of each component, making it overly verbose.

A better method involves storing this information with each component in the circuit. Interrogating these components will return the information derived from the original circuit for comparison with the components' new values. For example, the system may add a simple "node" object to the database which carries the information for the individual component. These nodes are unaffected by the scaling process and can carry the relevant information as properties.

Figure 22A:
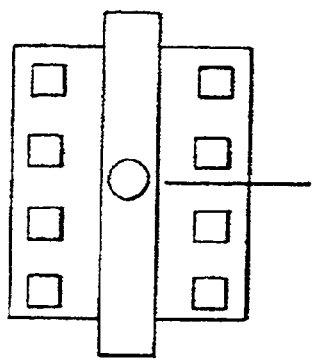
FIGS. 22a, 22b and 22c show nodes placed over a transistor, a resistor and a capacitor.
Figure 22B:
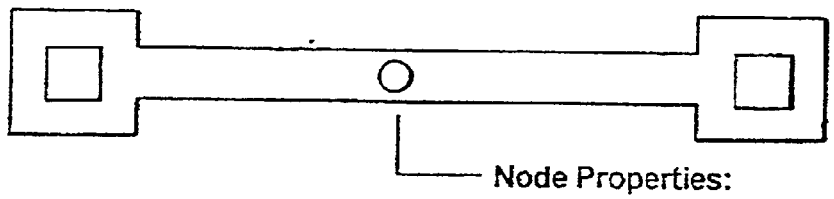
Figure 22C:
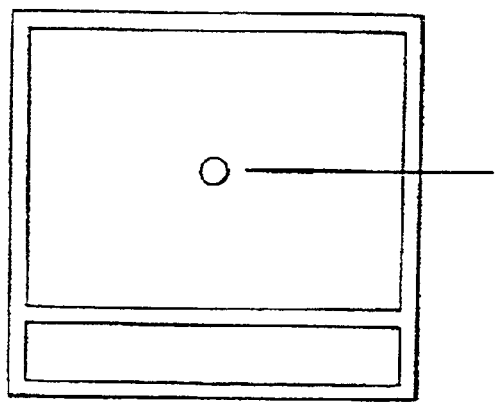

For example, FIGS. 22*a*, 22*b* and 22*c* show respectively a node placed over a CMOS transistor containing the original W/L values, a node placed over a resistor containing its type, dimensions and value, and a node placed over a capacitor containing its type, dimensions and value.

Figure 23:
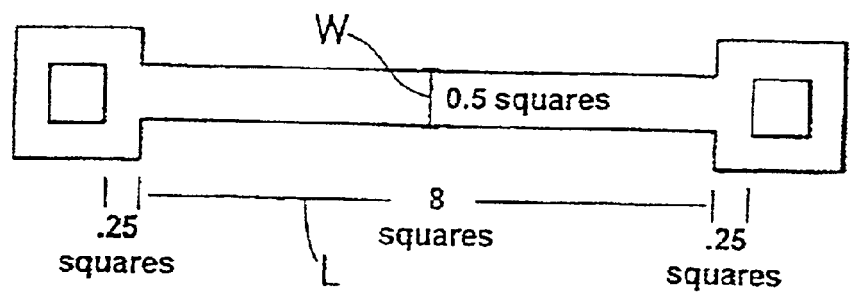
FIG. 23 shows size calculations for a resistor.

The resistor calculations will now be described in more detail with reference to FIG. 23. Resistors are created by placing a piece of semi-conducting material between two nodes. The two factors that define a resistors values are the resistance required and the current to be drawn.

The resistance value of a resistor is governed by the ratio of its width W to its length L and the "sheet resistivity" of the material from which it is made. In the example shown in FIG. 24, the resistor has the following values:

P-diffusion resistor. Resistivity=100 ohms per square.
Current density=100 $\mu$A per square.
Value=8.5 squares@ 100 ohms/square=850 ohms
Current=0.5 squares*100 $\mu$A/square=50 $\mu$A When applying the scaling factor to resistors, these ratios of the sheet resistivity and current density of the old and new resistor materials have to be taken into account to obtain the same value in the new resistors. As both the width and the length of the resistor will be equally affected, scaling a resistor will result in an identical number of squares and, therefore, an identical value. However, the sheet resistivity of the new process may be different and this will need to be taken in to account to calculate its value.

This is achieved using the equation:

new number of squares=(old resistivity/new resistivity)*old number of squares.

The width of the resistor after it has scaled will also affect the maximum current that the resistor can carry. The current involved will be dictated by the circuit around the resistor and so this value can only be obtained through examining circuit performance. If the resistor width needs to be increased to accommodate higher currents, the length must be scaled by an equal factor to maintain the same value of resistance.

Figure 24A:
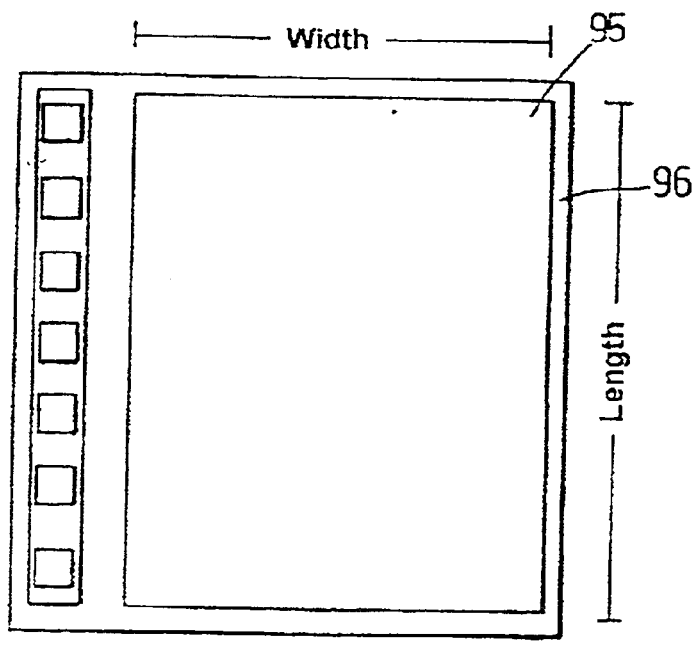
FIGS. 24a and 24b show size calculations for a capacitor.
Figure 24B:
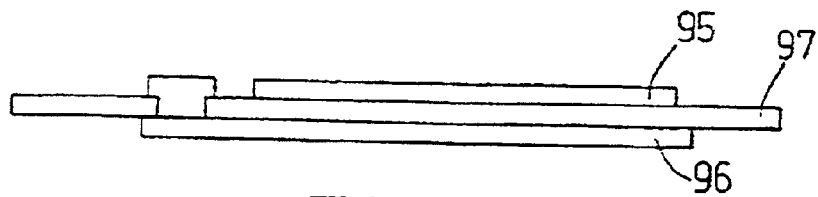

The capacitor calculations will now be described in more detail with reference to FIGS. 24a and 24b. Capacitors within an integrated circuit are formed by placing sheets of conducting or semi-conducting material 95,96 over one another with a third material 97 between them forming a dielectric. The types of layers that may be used are defined in the design rules for each manufacturing process and these will also specify the value of the capacitors as a number of Farads per square. As Farads are such large units, these will typically be defined in pico-farads or femto-farads.

The value of the capacitor is given by:

width*length*nF per unit area

As the value of a capacitor is almost entirely defined by its surface area, scaling a capacitor will always alter this value. If this is the case, the dimensions of the capacitor will need to be adjusted after the scaling process is complete to retain the value of the capacitor.

What is claimed is:

1. A method of modifying a data model of an integrated circuit by electronic means, wherein the data model includes at least one layer of circuit components and wherein the method includes the steps of:
    calculating a plurality of predetermined scaling ratios that include an interconnect scaling ratio including geometry width and spacing for each routing layer, a via size ratio in each via layer and a transistor geometry ratio;
    selecting a scaling factor that is equal to or greater than the largest of the predetermined scaling ratios;
    scaling the entire circuit represented by the data model with the scaling factor; and
    adjusting each layer in the circuit for functionality and design rule compliance.

2. A method according to claim 1, wherein the electronic means includes a computer program arranged to run on a computer.

3. A method according to claim 1, wherein the data model of the integrated circuit includes a design grid and wherein the scaling factor is selected by rounding up to the next whole design grid point from the largest of the predetermined scaling ratios.

4. A method according to claim 1, wherein the step of scaling the circuit according to the scaling factor includes multiplying the coordinates of the circuit geometry by the scaling factor.

5. A method according to claim 1, wherein the step of adjusting the circuit for functionality and design rule compliance includes a hierarchical layer scaling process whereby shapes in a sub-cell of the circuit may be scaled without breaking their connections with other parts of the circuit.

6. A method according to claim 5, wherein the hierarchical layer scaling process includes the step of identifying components that meet predetermined width criteria, and scaling only components that do not meet those criteria.

7. A method according to claim 1, wherein the step of adjusting the circuit for functionality and design rule compliance includes a transistor edge adjustment process.

8. A method according to claim 7, wherein the transistor edge adjustment process includes the step of adjusting the width of the polysilicon layer and/or the length of the diffusion layer.

9. A method according to claim 1, including the additional step of updating the contacts and vias by removing the existing contacts and vias and replacing them with new contacts and vias so as to reduce the current density through those contacts and vias.

10. A method according to claim 1, including the step of adding and/or deleting layers in accordance with the target manufacturing process.

11. A method according to claim 1, including the step of checking the circuit using a layout verification process.

12. A method according to claim 1, including the preliminary step of analyzing and modifying the circuit data.

13. A method according to claim 1, including the step of adding an information node containing design parameters to devices in the circuit.

14. A method of modifying a data model of an integrated circuit by electronic means, wherein the data model includes at least one layer of circuit components and wherein the method includes the steps of:
    selecting a scaling factor,
    scaling the circuit represented by the data model with the scaling factor,
    adjusting each layer in the circuit for functionality and design rule compliance, and
    performing a transistor edge adjustment process.

15. A method according to claim 14, wherein the electronic means includes a computer program arranged to run on a computer.

16. A method according to claim 14, wherein the scaling factor is selected by calculating a plurality of predetermined scaling ratios and selecting a scaling factor that is equal to or greater than the largest of the predetermined scaling ratios.

17. A method according to claim 16, wherein the predetermined scaling ratios include the interconnect scaling ratio including geometry width and spacing for each routing layer, the via size ratio in each via layer and the transistor geometry ratio.

18. A method according to claim 14, wherein the data model of the integrated circuit includes a design grid and wherein the scaling factor is selected by rounding up to the next whole design grid point from the largest of the predetermined scaling ratios.

19. A method according to claim 14, wherein the step of scaling the circuit according to the scaling factor includes multiplying the coordinates of the circuit geometry by the scaling factor.

20. A method according to claim 14, wherein the step of adjusting the circuit for functionality and design rule compliance includes a hierarchical layer scaling process whereby shapes in a sub-cell of the circuit may be scaled without breaking their connections with other parts of the circuit.

21. A method according to claim 20, wherein the hierarchical layer scaling process includes the step of identifying components that meet predetermined width criteria, and scaling only components that do not meet those criteria.

22. A method according to claim 14, wherein the transistor edge adjustment process includes the step of adjusting the width of the polysilicon layer and/or the length of the diffusion layer.

23. A method according to claim 14, including the additional step of updating the contacts and vias by removing the existing contacts and vias and replacing them with new contacts and vias so as to reduce the current density through those contacts and vias.

24. A method according to claim 14, including the step of adding and/or deleting layers in accordance with the target manufacturing process.

25. A method according to claim 14, including the step of checking the circuit using a layout verification process.

26. The method according to claim 14, including the preliminary step of analyzing and modifying the circuit data.

27. The method according to claim 14, including the step of adding an information node containing design parameters to devices in the circuit.

* * * * *